United States Patent
Wang et al.

(12) 
(10) Patent No.: US 6,465,340 B1
(45) Date of Patent: Oct. 15, 2002

(54) VIA FILLED DUAL DAMASCENE STRUCTURE WITH MIDDLE STOP LAYER AND METHOD FOR MAKING THE SAME

(75) Inventors: Fei Wang, San Jose; Lynne A. Okada, Sunnyvale; Ramkumar Subramanian, San Jose; Calvin T. Gabriel, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/776,734

(22) Filed: Feb. 6, 2001

(51) Int. Cl.[7] .......................................... H01L 21/4763
(52) U.S. Cl. ........................ 438/622; 438/624; 438/637
(58) Field of Search ................................ 438/622, 624, 438/637

(56) References Cited

U.S. PATENT DOCUMENTS

| | | | |
|---|---|---|---|
| 6,001,730 A | * 12/1999 | Farkas et al. | 438/627 |
| 6,127,258 A | * 10/2000 | Watanabe et al. | 438/625 |
| 6,245,670 B1 | * 6/2001 | Cheung et al. | 438/637 |
| 6,252,290 B1 | * 6/2001 | Quek et al. | 257/522 |
| 6,259,160 B1 | * 7/2001 | Lopatin et al. | 257/762 |
| 6,287,961 B1 | * 9/2001 | Liu et al. | 438/638 |

* cited by examiner

*Primary Examiner*—T. N. Quach

(57) ABSTRACT

An interconnect structure and method of forming the same in which a first inorganic low k dielectric material is deposited over a conductive layer to form a first dielectric layer. An etch stop layer is formed on the first dielectric layer. The etch stop layer and the first dielectric layer are etched to form a via in the first dielectric layer. A second low k dielectric material is deposited within the via and over the etch stop layer to form a second dielectric layer over the via and the etch stop layer. The re-filled via is simultaneously etched with the second dielectric layer in which a trench is formed. A portion of the trench is directly over the via. The re-opened via and the trench are filled with a conductive material.

6 Claims, 5 Drawing Sheets

VIA FILLED DUAL DAMASCENE STRUCTURE WITH MIDDLE STOP LAYER AND METHOD FOR MAKING THE SAME

RELATED APPLICATIONS

The present application contains subject matter related to subject matter disclosed in copending U.S. patent application Ser. No. 09/778,070, filed on Feb. 7, 2001, Ser. No. 09/778, 544, filed on Feb. 21, 2001, and Ser. No. 09/788, 472, filed on Feb. 21, 2001.

FIELD OF THE INVENTION

The present invention relates to the formation of metal interconnection layers during the manufacture of semiconductor devices, and more particularly to the formation of a damascene structure in a metal interconnect region by a via fill dual damascene technique.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High-performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and hence, the circuit speed. As integration density increases and feature size decreases in accordance with sub-micron design rules, e.g., a design rule of about 0.1 micron and below, the rejection rate due to integrated circuit speed delays severely limits production throughput and significantly increases manufacturing costs.

In prior technologies, aluminum was used in very large scale integration interconnect metalization. Copper and copper alloys have received considerable attention as a candidate for replacing aluminum in these metalizations. Copper has a lower resistivity than aluminum and improved electrical properties compared to tungsten, making copper a desirable metal for use as a conductive plug as well as conductive wiring.

In the formation of a dual damascene structure in a self-aligned manner, a conductive line and vias that connect the line to conductive elements in a previously formed underlying conductive layer, are simultaneously deposited. A conductive material is deposited into openings (e.g., the via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer. A pattern is then etched into the middle etch stop layer to define the feature, such as a via hole, that will later be etched into the first dielectric layer. Once the middle etch stop layer is patterned, a second dielectric layer is deposited on the middle etch stop layer. The hard mask layer may then be deposited on the second dielectric layer. A desired feature, such as a trench, is etched through the hard mask layer and the second dielectric layer. This etching continues so that the first dielectric layer is etched in the same step as the second dielectric layer. The etching of the two dielectric layers in a single etching step reduces the number of manufacturing steps. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, etc., are often more difficult to handle than traditionally employed higher k materials, such as an oxide. For example, inorganic low k dielectric materials are readily damaged by techniques used to remove photoresist materials after the patterning of a layer. Hence, a feature formed in an inorganic low k dielectric layer may be damaged when the photoresist layer used to form the trench is removed. This is of special concern in a dual damascene arrangement if formed in a conventional manner since the inorganic material in the lower, via layer, will be damaged two times. In other words, the inorganic dielectric material in the via layer will be damaged a first time by the removal of photoresist used in forming the via. The same inorganic low k dielectric material in the via layer will also be damaged a second time when the upper layer, the trench layer, is patterned and the photoresist is removed.

There is a need for a method and arrangement for providing interconnect structure which allows an inorganic low k dielectric layer to be employed in a via layer without subjecting the via to two separate damaging process steps.

SUMMARY OF THE INVENTION

These and other needs are met by embodiments of the present invention which provide a method of forming an interconnect structure comprising the steps of depositing a first low k dielectric material over a conductive layer to form a first dielectric layer. An etch stop layer is formed on the first dielectric layer. The etch stop layer and the first dielectric layer are etched to form a via in the first dielectric layer. The second low k dielectric material is then deposited in the via and over the etch stop layer to form a second dielectric layer over the via and the etch stop layer. The via is etched simultaneously with a trench in the second dielectric layer. At least a portion of the trench is directly over the via. The first low k dielectric material and the second low k dielectric material are both inorganic low k dielectric materials.

By depositing a second low k dielectric material within the via, after the initial formation of the via, the second etching of a via is through newly deposited dielectric material. This has the advantage of reducing the amount of damage sustained in the via formed in the inorganic low k dielectric material in the via layer by a resist removal process. This has the effect of increasingly structural integrity of the inorganic low k dielectric layer and the formation of the conductive plug in the first dielectric layer.

The earlier stated needs are met by another embodiment of the present invention which provides a method of forming an interconnect structure comprising forming a via in a first dielectric layer and depositing a second dielectric layer on the first dielectric layer and in the via. The dielectric material in the first dielectric layer and in the second dielectric layer is inorganic dielectric material. The second dielectric layer and the filled via are simultaneously etched to form a trench in the second dielectric layer, and a via in the first dielectric layer. The via and the trench are then filled with conductive material.

The earlier stated needs are also met by another embodiment of the present invention which provides an interconnect structure comprising a first dielectric layer comprising a first inorganic dielectric material. The interconnect structure also has an etch stop layer with an opening and a second dielectric over the etch stop layer. The second dielectric layer comprises a second inorganic dielectric material, with some of the second inorganic dielectric material being in the first dielectric layer within a via region defined by the etched stop layer opening. A conductive stud is provided within a via formed in the via region of the first dielectric layer. A conductive line is formed in the second dielectric layer at least partially over the via.

The foregoing and other features, aspects, and advantages of the present invention will become more apparent in the following detail description of the present invention when taken in conjunction with the accompanying drawings.

DETAILED DESCRIPTION OF THE INVENTION

The present invention addresses and solves problems associated with the use of low k dielectric materials in the dielectric layers of a self-aligned dual damascene arrangement in a metal interconnect region of a semiconductor chip. Specifically, the present invention lowers the overall dielectric constant value of the film and prevents extensive damage to the lower dielectric layer of the dual damascene arrangement. This is accomplished, in part, by providing an inorganic low k dielectric layer as the bottom dielectric layer in the dual damascene arrangement. After forming an initial via in the bottom dielectric layer, and removing the photoresist used to pattern this via, the via is filled again with low k dielectric material that is used to form the second low k dielectric layer. When the second dielectric layer is etched to form the line or other feature in the second dielectric layer, the filled via is again etched to re-open the via. Hence, the re-opened via will only be exposed a single time to the damaging step of removing the photoresist, which will occur upon the removal of the photoresist employed to pattern the second dielectric layer.

Figure 1:
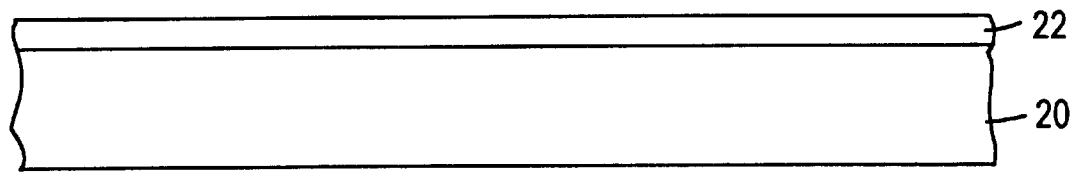
FIG. 1 is a cross-section of a metal interconnect portion of a semiconductor wafer after a first etch stop layer is deposited on an underlying conductive interconnection layer, in accordance with embodiments of the present invention.

FIG. 1 depicts a cross-section of a metal interconnect portion of a chip processed in accordance with embodiments of the present invention, at one stage of the processing. At this stage, a conductive layer 20 has been formed, which may be made of a metal, for example, or other conductive material. In especially preferred embodiments, the conductive metal is copper or a copper alloy, due to the earlier stated advantages of copper over other metals. A first etch stop layer 22 is formed, by deposition, for example, over the conductive layer 20. The first etch stop layer 22, in certain embodiments, is made of silicon nitride. Other materials may be used for the first etch stop layer 22, such as silicon oxynitride, silicon carbide, etc. A primary purpose of the first etch stop layer 22 is to protect the conductive material 20 during etching of the overlying dielectric layers. The first etch stop layer 22 also serves as a diffusion barrier to prevent diffusion of conductive material, such as copper, into surrounding dielectric material.

Figure 2:
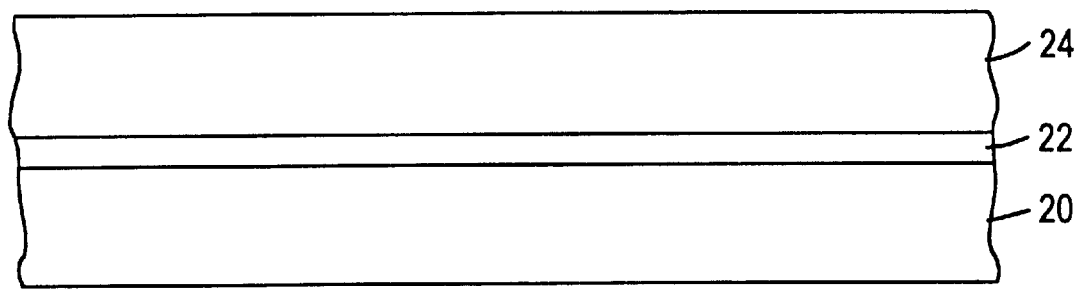
FIG. 2 is a cross-section of the metal interconnect portion of FIG. 1, after a first dielectric layer is formed on the first etch stop layer, in accordance with the embodiments of the present invention.

As shown in FIG. 2, a first dielectric layer 24 is then formed on the first etch stop layer 22. In the present invention, the material forming the first dielectric layer 24 is an inorganic dielectric material. In particularly preferred embodiments, the inorganic dielectric material is an inorganic low k dielectric material. An example of an inorganic dielectric material is a silicon oxide, such as $SiO_2$. Examples of inorganic low k dielectric materials include methyl silsesquioxane (MSQ), hydrogen silsesquioxane (HSQ), and fluorinated TEOS (FTEOS). For purposes of example, assume that the first dielectric layer 24 is formed to a thickness of between about 1,000 and about 8,000 Å.

Figure 3:
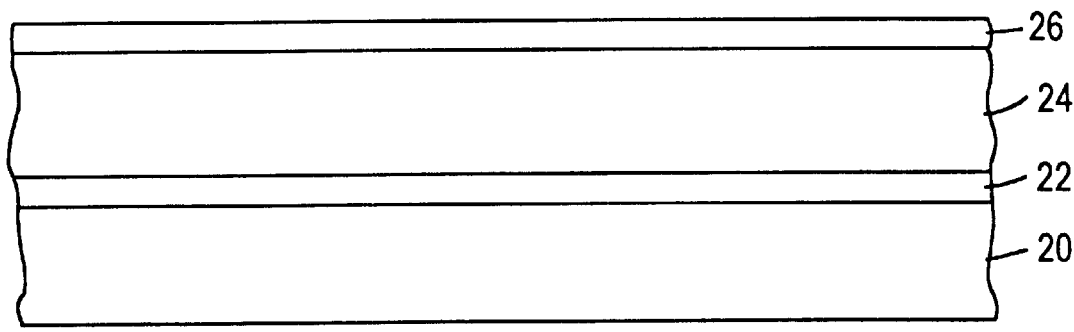
FIG. 3 is a cross-section of the metal interconnect portion of FIG. 2, following deposition of a second etch stop layer on the first dielectric layer, in accordance with the embodiments of the present invention.

A second, middle etch stop layer 26 is deposited on the first dielectric layer 24, as depicted in FIG. 3. The second etch stop layer 26 comprises an oxide, such as silicon dioxide, a nitride, such as silicon nitride, or silicon oxynitride, for example. An advantage of silicon oxynitride over silicon nitride is its lower dielectric constant, and can also be used as an anti-reflective coating. Another example of a suitable etch stop layer is silicon carbide. Other materials suitable for serving as an etch stop layer may also be used instead of the above examples. The first dielectric layer 24 is partially protected by the second etch stop layer 26 during the etching of the second dielectric layer when the trench is later formed in that layer. Hence, the second etch stop layer 26 prevents damage to the top surface of the first dielectric layer 24 from photoresist removal processes.

Figure 4:
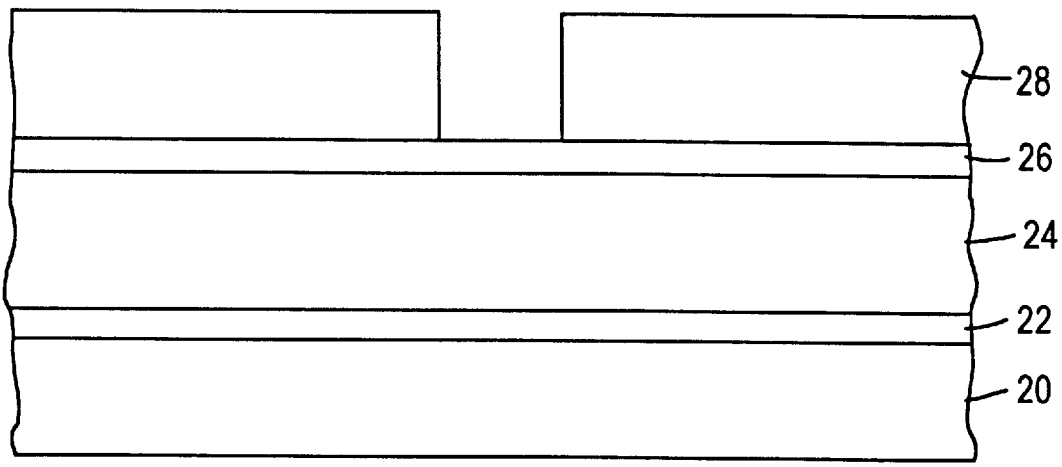
FIG. 4 is a cross-section of the portion of FIG. 3, following the position and patterning of a photoresist layer on the second etch stop layer to define a feature to be etched into the second etch stop layer, in accordance with the embodiments of the present invention.

FIG. 4 is a cross-section of the metal interconnect portion of FIG. 3 following the positioning and patterning of a photoresist layer 28 on the second etch stop layer 26. The pattern created within the photoresist layer 28 defines the feature, such as a via, that will eventually be etched into the first dielectric layer 24.

Figure 5:
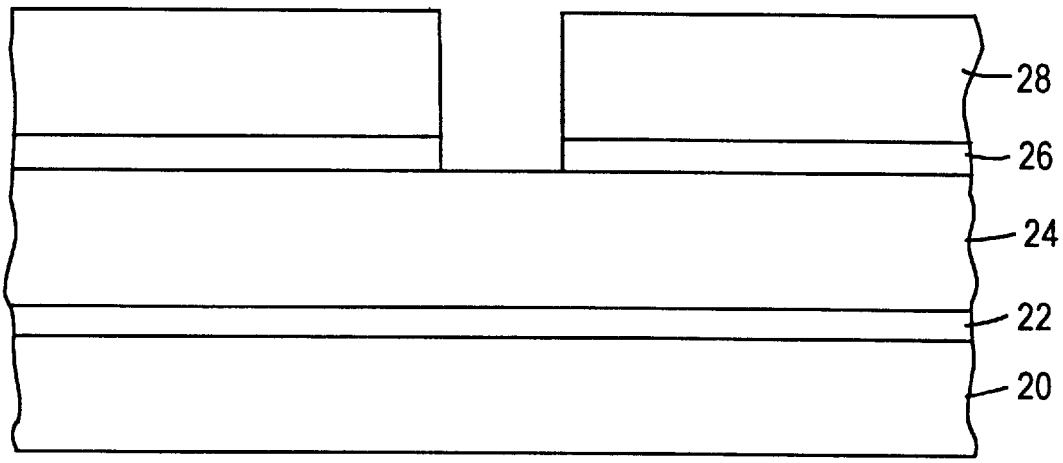
FIG. 5 is a cross-section of the portion of FIG. 4, after the second etch stop layer is etched in accordance with the pattern in the photoresist layer, in accordance with the embodiments of the present invention.

FIG. 5 depicts the cross-section of FIG. 4 after the second etch stop layer 26 has been etched in accordance with the pattern in the photoresist layer 28. When the second etch stop layer 26 is silicon oxynitride, for example, the second etch stop layer 26 is etched with an etchant chemistry that is selective to silicon oxynitride so that the underlying first dielectric layer 24 is not substantially etched. An exemplary suitable etchant chemistry is $CHF_3/N_2$.

Figure 6:
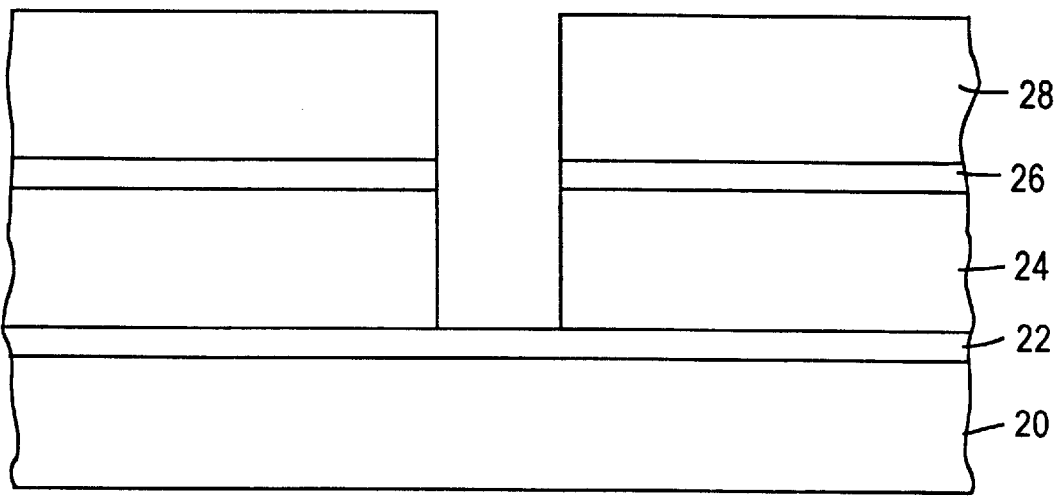
FIG. 6 is a cross-section of the portion of FIG. 5, after the first dielectric layer has been etched in accordance with the pattern that has been etched in the second etch stop layer, in accordance with the embodiments of the present invention.

FIG. 6 is a cross-section of the portion of FIG. 5 following the etching of the first dielectric layer 24 in accordance with the embodiments of the present invention. An exemplary etchant includes $CHF_3/O_2/Ar$, or $CF_4$, $C_4F_8$, or $C_2F_6$. These etchants are exemplary only, as a suitable etchant employed depending on the particular inorganic dielectric material comprising the first dielectric layer. The etchant should be selective such that the material on the first dielectric layer 24 is etched, with the etching stopping at the first etch stop layer 22.

Figure 7:
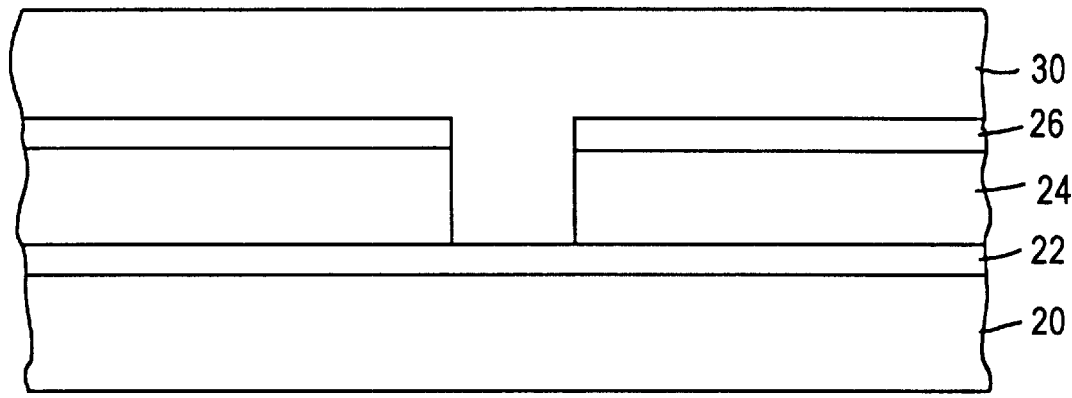
FIG. 7 is a cross-section of the portion of FIG. 6, following removal of the photoresist layer and the formation of a second dielectric layer on the second etch stop layer and the filling of the via in the first dielectric layer, in accordance with the embodiments of the present invention.

FIG. 7 is a cross-section of the portion of FIG. 6 following the removal of the photoresist layer 28 and the formation of a second dielectric layer 30 over the second etch stop layer 26. The dielectric material in the second dielectric layer 30 also fills the via that was previously opened in the first dielectric layer 24, as was depicted in FIG. 6. This has the result that the previously opened via, which may have been damaged by the removal of the photoresist layer 28, has been refilled with dielectric material that has not been damaged. Two of the fours sides of the re-filled via will only be damaged once by a photoresist removal process, while the two remaining sides will be damaged twice by photoresist removal processes.

The dielectric material in the second dielectric layer 30 and in the re-filled via in the first dielectric layer 24 is also an inorganic dielectric material in the embodiments of the present invention. The inorganic dielectric material may be the same as that present in the first dielectric layer 24, or it may be a different inorganic dielectric material. For example, the inorganic dielectric material in the first dielectric layer 24 may be MSQ, while the inorganic dielectric material in the second dielectric layer 30 and the via may be HSQ, for example. Although the same etchant can be used to etch two different dielectric materials, depending on the materials used, it should be appreciated that the use of the same dielectric material in the second dielectric layer 30 and in the re-filled via in the first dielectric layer 24 ensures that a single etchant can be employed to etch both the trench and the re-filled via. It is preferred for the material in the second dielectric layer 30 to have good gap filling qualities, so that the via will be completely filled. Those of ordinary skill in the art may readily select such a material taking into account this consideration.

Figure 8:
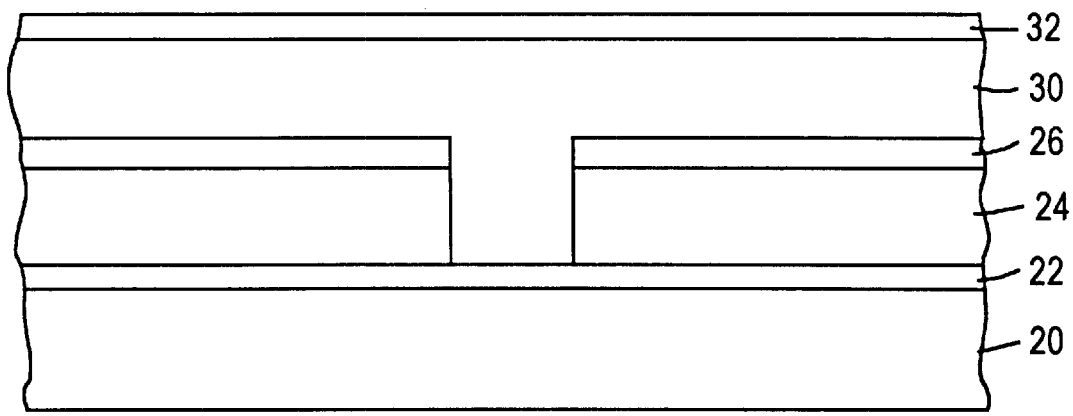
FIG. 8 is a cross-section of the portion of FIG. 7, following the deposition of a hard mask layer on the second dielectric layer, in accordance with the embodiments of the present invention.

In certain embodiments, planarization is not required. In other embodiments, planarization of the second dielectric layer 30 is performed, such as by CMP. In either embodiment, a hard mask layer 32 is deposited on the second dielectric layer 30, as depicted in FIG. 8. The hard mask layer 32 may comprise silicon oxide or silicon nitride, for example, and serves to selectively protect the second dielectric layer 30 during the etching steps.

Figure 9:
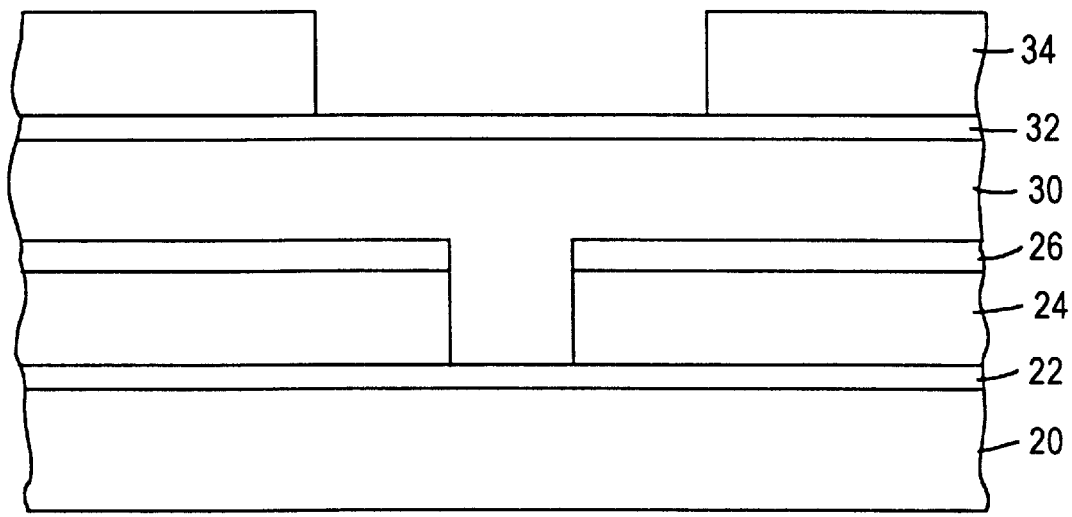
FIG. 9 is a cross-section of the portion of FIG. 8, following the deposition and patterning of a photoresist layer on the second dielectric layer to define a first feature to be etched in the second dielectric layer, in accordance with the embodiments of the present invention.
Figure 10:
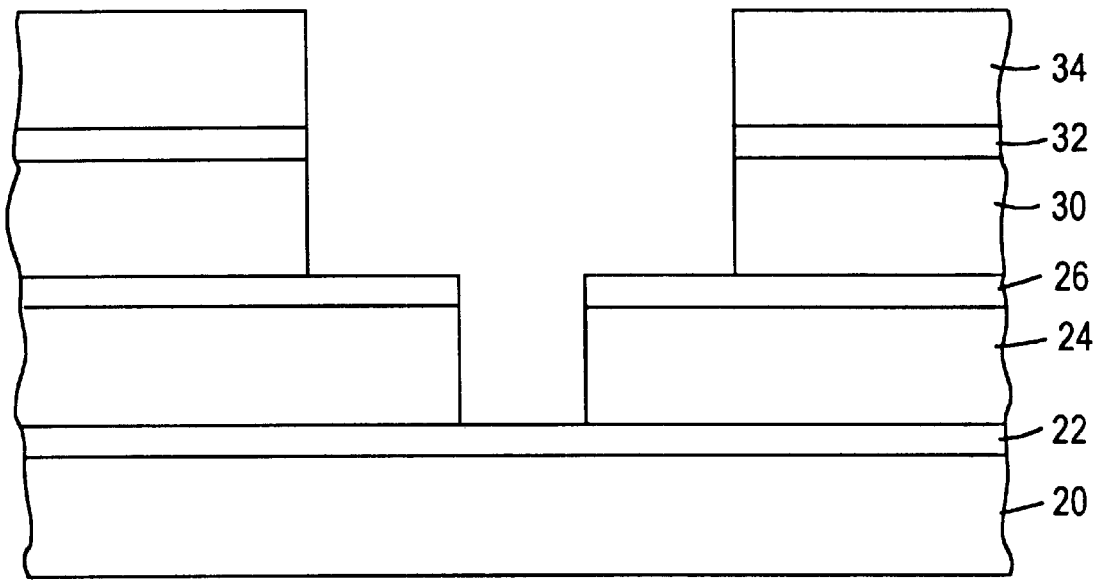
FIG. 10 is a cross-section of the portion of FIG. 9, after etching through the hard mask layer and the second dielectric layer in accordance with the pattern in the photoresist layer to create a first feature in the second dielectric layer, and etching through the second etch stop layer and the filled via to define a via in the first dielectric layer, in accordance with the embodiments of the present invention.

As shown in FIG. 9, a photoresist layer 34 is then positioned and patterned on the hard mask layer 32. The pattern in the photoresist layer 34 contains a feature that is to be etched into the second dielectric layer 30. The desired feature, such as a trench opening, is created (see FIG. 10) by etching the hard mask layer 32 and the second dielectric layer 30. The etching stops at the second etch stop layer 26, except for the opening above the re-filled via. The etching continues to completely etch out the re-filled via, stopping at the first etch stop layer 22. In preferred embodiments of the invention, multiple etching steps are used to create the structure depicted in FIG. 10. These steps include etching the hard mask layer 32, followed by simultaneously etching the second dielectric layer 30 and the re-filled via in the first dielectric 24.

A suitable etchant chemistry for etching the nitride hard mask layer 32 is $CHF_3/N_2$. The etchant chemistry employed to etch the second dielectric layer 30 and the re-filled via may be the same etchant chemistry as previously employed to etch the first dielectric layer 24.

Figure 11:
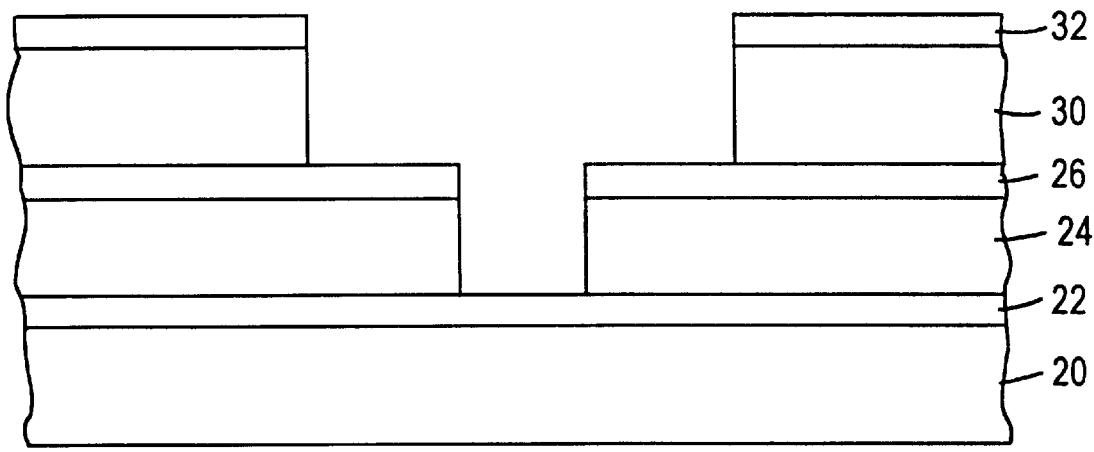
FIG. 11 is a cross-section of the portion of FIG. 10, following removal of the photoresist layer, in accordance with the embodiments of the present invention.

As seen in FIG. 11, the photoresist layer 34 may be removed by an etching or oxygen ashing process. This may cause damage to the re-opened via in the first dielectric layer 24 and the trench formed in the second dielectric layer 30. However, the re-opened via and the trench are subjected only to a single photoresist removal step that may damage them. This provides an improvement in the structure of the via over processes in which the inorganic dielectric material is subjected to multiple process steps in which the feature may be damaged.

Figure 12:
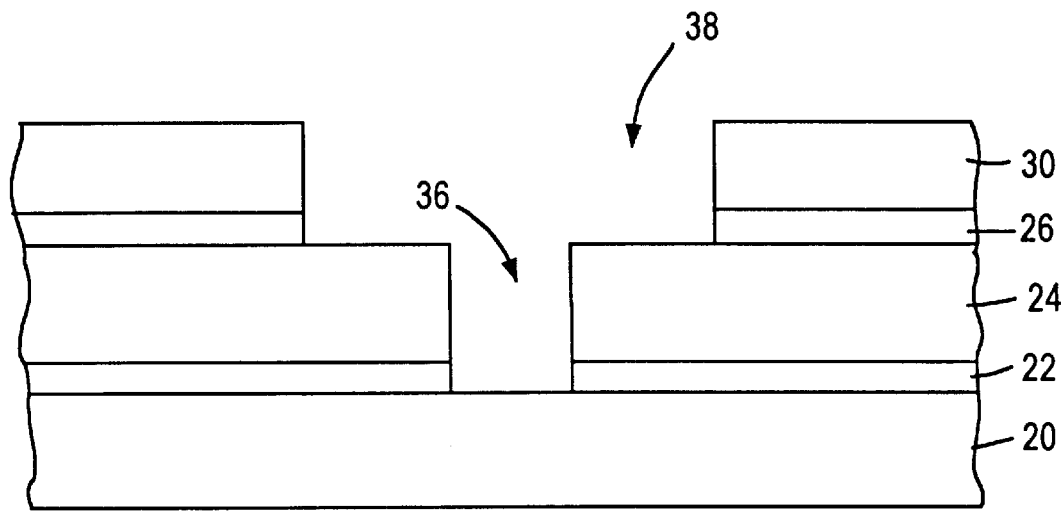
FIG. 12 is a cross-section of the portion of FIG. 11, following etching of the first etch stop layer, in accordance with the embodiments of the present invention.

The first etch stop layer 22 is now etched within the re-opened via that now exists in the first dielectric layer 24, as seen in FIG. 12. This removes the etch stop material covering the conductive material on the conductive layer 20. A suitable etchant to remove the etch stop material, for example silicon nitride, while not adversely affecting the conductive material (e.g., copper), is $CHF_3/N_2$. This etchant chemistry prevents copper oxidation, removes sidewall polymer with $N_2$, and etches the nitride without undercutting the dielectric material in the second dielectric layer 30 or the dielectric material in the first dielectric layer 24. The etching of the first etch stop layer 22 leaves a first opening 36, such as a via hole, and a second opening 38, such as a trench. The etching of the first etch stop layer 22 may be performed in situ with the previous etching steps.

Figure 13:
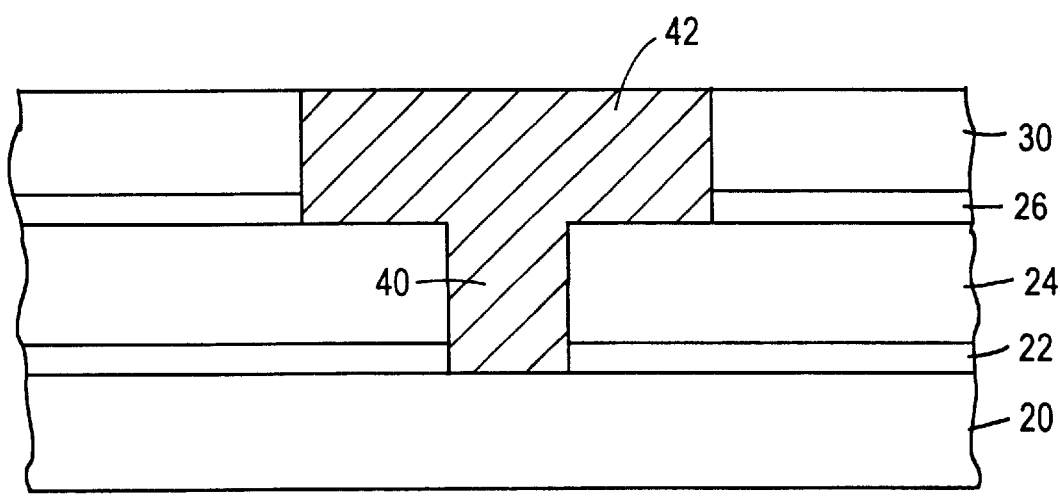
FIG. 13 is a cross-section of the portion of FIG. 12, after the first and second features are filled with a conductive material, in accordance with the embodiments of the present invention.

The via hole 36 and the trench 38 are now filled in a simultaneous deposition step with conductive material, preferably copper in certain embodiments of the present invention. Deposition of a barrier layer, typically employed to prevent copper diffusion, is not depicted in order not to obscure the invention, although one can be provided. Also, in certain embodiments of the invention, barrier layers not needed as certain low k dielectric materials form a self-barrier against copper diffusion. After chemical mechanical planarization (CMP), the dual damascene structure of FIG. 13 is formed with the via (or stud) 40 electrically connecting the underlying conductive layer 20 to the conductive line 42 formed in the trench 38.

The filling of a previously formed via during the position of a second dielectric layer allows the formation of a via that is subjected to only one damaging process, instead of multiple damaging processes, such as photoresist removals. This enhances the integrity of the features formed in the lower dielectric layer, such as a via layer, while allowing the use of inorganic low k dielectric materials in both layers of a dual damascene arrangement.

Although the present invention has been described and illustrated in detailed, it is to be clearly understood that the same is by way of illustration and example only and is not to be taken by way of limitation, the scope of the present invention being limited only by the terms of the appended claims.

What is claimed is:

1. A method of forming an interconnect structure, comprising the steps of:

depositing a first low k dielectric material over a conductive layer to form a first dielectric layer;

forming an etch stop layer on the first dielectric layer;

etching the etch stop layer and the first dielectric layer to form a via in the first dielectric layer;

depositing a second low k dielectric material in the via and over the etch stop layer to form a second dielectric layer over the via and the etch stop layer;

simultaneously etching the via and a trench in the second dielectric layer, with at least a portion of the trench being directly over the via;

wherein the first low k dielectric material and the second low k dielectric material are both inorganic low k dielectric materials.

2. The method of claim 1, wherein the first low k dielectric material and the second low k dielectric material are different inorganic low k dielectric materials.

3. The method of claim 1, wherein the first low k dielectric material and the second low k dielectric material are the same inorganic low k dielectric materials.

4. The method of claim 1, further comprising depositing conductive material simultaneously in the via and the trench.

5. The method of claim 4, wherein the conductive material is copper.

6. The method of claim 1, wherein the first and second low k dielectric materials are selected from at least one of methyl silsesquioxane (MSQ), hydrogen silsesquioxane (HSQ), and fluorine tetraethylorthosilicate (FTEOS).

* * * * *